United States Patent
Wu et al.

(10) Patent No.: US 6,998,304 B2
(45) Date of Patent: Feb. 14, 2006

(54) METHOD FOR INTEGRATED MANUFACTURING OF SPLIT GATE FLASH MEMORY WITH HIGH VOLTAGE MOSFETS

(75) Inventors: Haw-Chuan Wu, Hsin-Chu (TW); Jiann-Tyng Tzeng, Hsin-Chu (TW); David Ho, Taichung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 115 days.

(21) Appl. No.: 10/791,599

(22) Filed: Mar. 1, 2004

(65) Prior Publication Data

US 2005/0191800 A1    Sep. 1, 2005

(51) Int. Cl.
    *H01L 21/8238*  (2006.01)
(52) U.S. Cl. .................................. 438/209; 438/695
(58) Field of Classification Search ........ 438/197–200, 438/209, 213, 238, 257, 279, 695
    See application file for complete search history.

(56) References Cited

U.S. PATENT DOCUMENTS

| 5,200,636 | A  | * | 4/1993  | Uemura et al. ............. 257/315 |
| 5,712,201 | A  | * | 1/1998  | Lee et al. .................... 438/239 |
| 6,333,223 | B1 | * | 12/2001 | Moriwaki et al. .......... 438/241 |
| 6,509,232 | B1 | * | 1/2003  | Kim et al. ................... 438/264 |

* cited by examiner

*Primary Examiner*—David Nelms
*Assistant Examiner*—Calvin Lee
(74) *Attorney, Agent, or Firm*—R. W. Tung

(57) ABSTRACT

A method for integrated processing of a high Voltage MOSFET device and a split gate MOSFET device whereby a novel method is provided to form the split gate device and the high voltage MOSFET device in parallel processing steps including an oxide formation step whereby an oxide spacer layer in a split gate device is formed using about the same overall thermal budget while forming in parallel a thick gate oxide for a an embedded high voltage MOSFET device.

20 Claims, 4 Drawing Sheets

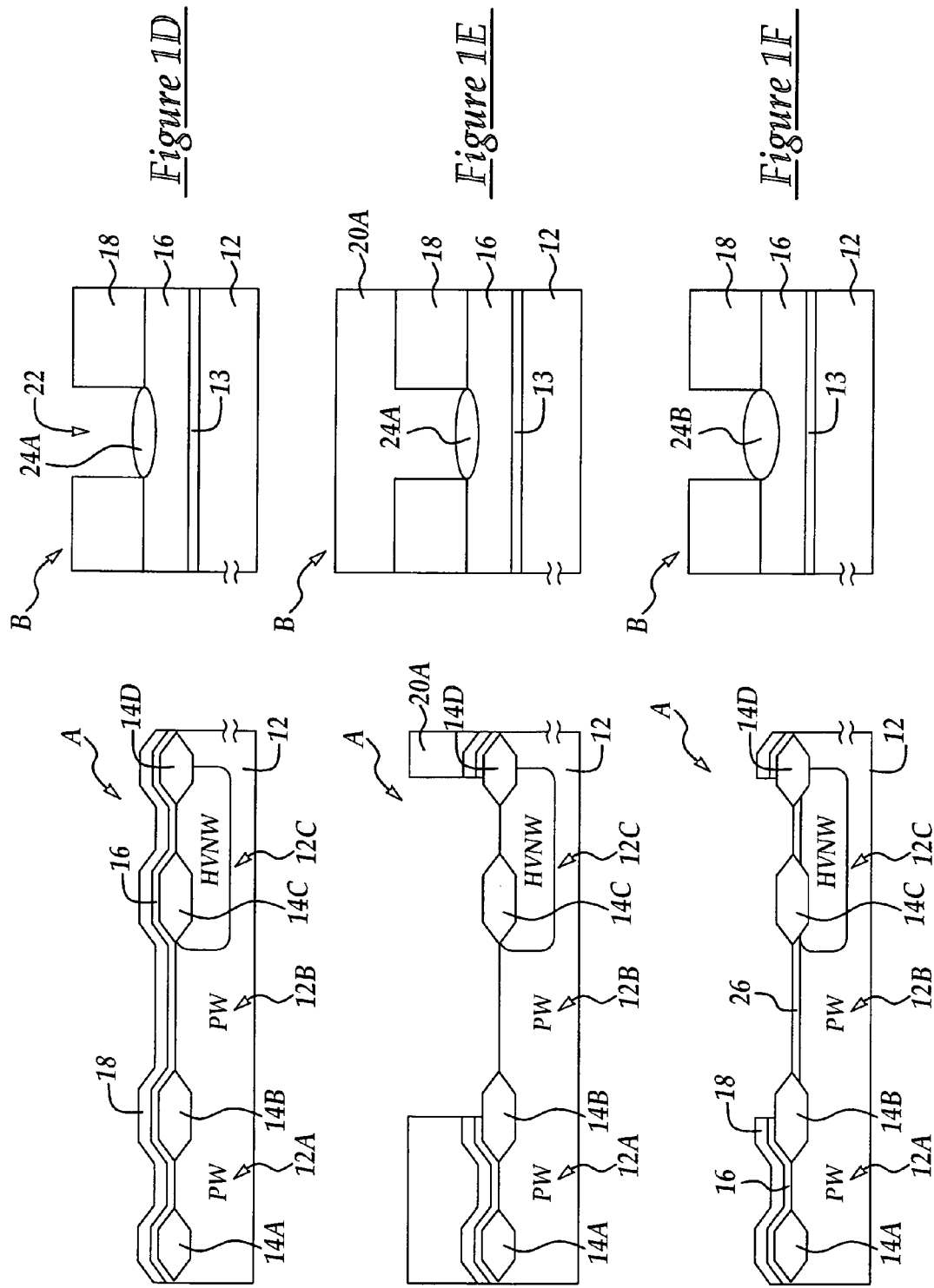

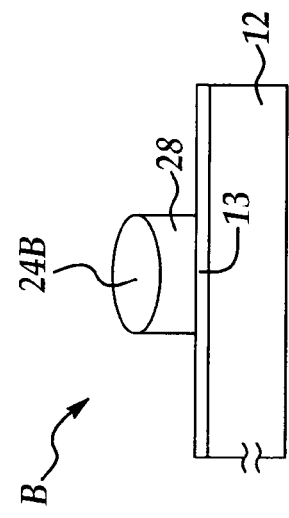
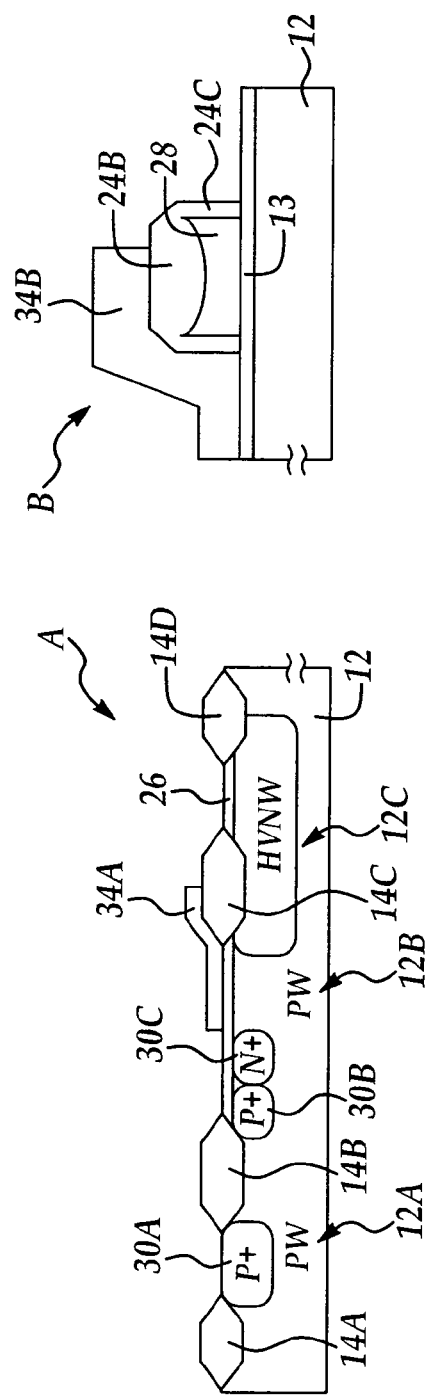
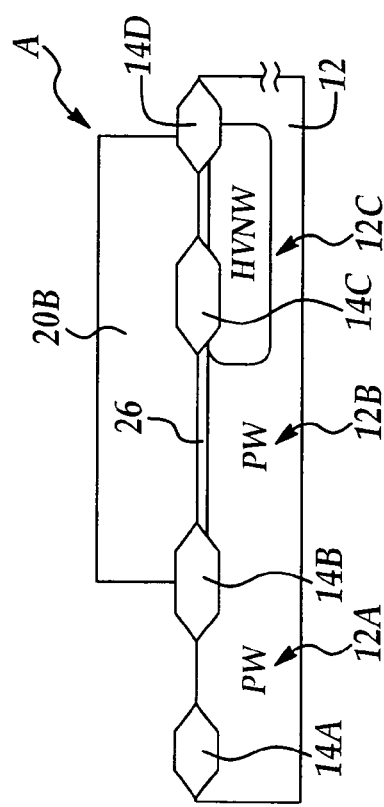

US 6,998,304 B2

METHOD FOR INTEGRATED MANUFACTURING OF SPLIT GATE FLASH MEMORY WITH HIGH VOLTAGE MOSFETS

FIELD OF THE INVENTION

This invention generally relates to microelectronic integrated circuit (IC) semiconductor device fabrication and more particularly to a method for integrated manufacturing of split gate flash memory with high voltage MOSFETS.

BACKGROUND OF THE INVENTION

With increasing demands for embedded memory type structures, mixed-signal circuits, and system on chip (SOC) IC design, it has become necessary to form multiple transistor structures on a single die to achieve integrated functioning of the different transistor structures. For example, transistors with different structures and functions typically operate under different current and voltage parameters requiring different processing steps for the various transistors. For example, in the formation of high Voltage MOSFETS, for example operating at Voltages higher than about 30 Volts, for example, about 40 to about 60 Volts, the gate oxide is required to be much thicker for proper operation and to avoid dielectric breakdown.

On the other hand, split gate flash memory MOSFETS require oxide layers which involve thermal processing cycles including oxide and nitride depositions that are incompatible with the formation of other types of transistors formed on the same process wafer and within the same die, for example in embedded memory applications, including high voltage MOSFETS. The incompatible processes require different and separate processing steps which add to the cost of production including increased cycle time to decrease wafer throughput. In addition, the thermal cycles required by separate process may have an adverse effect on different types of transistors, for example by undesirably subjecting one transistor type in the embedded or integrated device to thermal cycling processes which have an adverse effect on, for example, dopant profiles, thereby altering electrical properties.

Thus, there is a need in the semiconductor manufacturing art for improved processing methods for integrating the processing methods for the formation of embedded devices to increase throughput and improved device reliability.

It is therefore an object of the invention to provide an improved processing method for integrating the processing methods for the formation of embedded devices including high Voltage MOSFETS and split gate flash memory to increase throughput and improved device reliability while overcoming other shortcomings and deficiencies of the prior art.

SUMMARY OF THE INVENTION

To achieve the foregoing and other objects, and in accordance with the purposes of the present invention, as embodied and broadly described herein, the present invention provides a method for integrated processing of an embedded high Voltage MOSFET device with a split gate MOSFET device.

In a first embodiment, the method includes providing a silicon substrate comprising a first device active region and a second active device region said first and second active device regions comprising a first polysilicon layer overlying the silicon substrate and a silicon nitride layer overlying the first polysilicon layer; photolithographically patterning and etching through a thickness portion of the silicon nitride layer to expose a polysilicon portion of the first polysilicon layer in the second active device region; growing a first portion of an oxide layer overlying the polysilicon portion while blocking oxide growth over the first active region; etching selected portions of the silicon nitride layer and first polysilicon layer to form exposed portions of the silicon substrate over the first active region while leaving the second active region unetched; and, thermally growing a gate oxide layer over the exposed portions of the silicon substrate in the first active region to a predetermined thickness while simultaneously growing a second portion of the oxide layer over the second active region to form the oxide layer at a final predetermined thickness.

These and other embodiments, aspects and features of the invention will be better understood from a detailed description of the preferred embodiments of the invention which are further described below in conjunction with the accompanying Figures.

BRIEF DESCRIPTION OF THE DRAWINGS

FIGS. 1A–1H are cross sectional side views of a portion of an embedded high Voltage semiconductor device and a split gate flash memory device at parallel manufacturing stages according to embodiments of the present invention.

DETAILED DESCRIPTION OF THE PREFERRED EMBODIMENTS

Figure 1A:
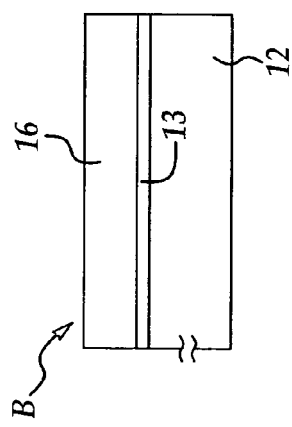
Figure 1A:
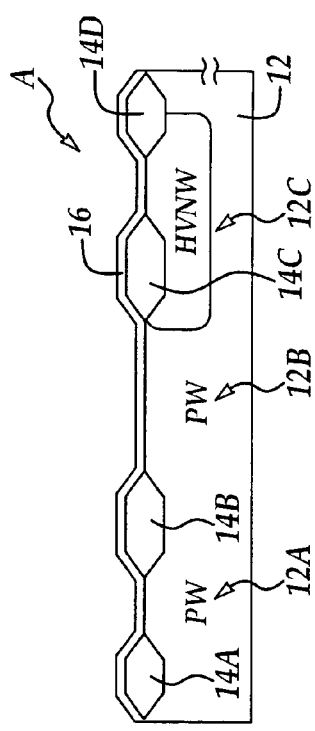

Referring to FIG. 1A is are shown juxtaposed cross sectional representations of portions of a process wafer. For example, wafer portion A, representing a portion of a high Voltage (HV) device region is shown juxtaposed to wafer portion B, representing a portion of a flash memory cell including a portion of a split gate MOSFET whereby wafer portions A and B are shown at parallel stages in an integrated manufacturing process. It will be appreciated that wafer portions A and B of the process wafer represent parallel stages in manufacture showing the parallel effects of processing steps of the exemplary embodiment of the present invention.

Shown in FIG. 1A, portion A, are field oxide (FOX) LOCOS isolation structures 14A, 14B, 14C, and 14D formed overlying silicon substrate 12 including doped P-Well regions 12A and 12B, and HV N-well doped region 12C. The FOX LOCOS isolation structures are formed following formation of the doped regions, for example by first patterning an overlying silicon nitride layer to expose selected portions of the silicon substrate 12 and performing a wet or dry furnace oxidation growth process at a temperature of about 850° C. to about 1050° C., more preferably about 900° C. followed by nitride stripping to leave the birds beak shaped LOCOS FOX structures. Although not shown, following growth of the LOCOS FOX structures and nitride stripping, a sacrificial oxide layer (not shown) from about 200 Angstroms to about 400 Angstroms may optionally be grown over the exposed silicon regions of substrate 12.

Still referring to FIG. 1A, wafer portion B, shown in an expanded view for clarity, includes a gate oxide layer 13, of about 50 Angstroms to about 150 Angstroms in thickness, formed overlying silicon substrate 12, thermally grown by conventional wet or dry methods, for example in a dry furnace of rapid thermal oxidation (RTO) process or an in-situ steam generated (ISSG) process carried out at a temperature of about 800° C. to about 1050° C.

Still referring to FIG. 1A, a polysilicon layer 16, is blanket deposited over the process wafer surface including both A and B wafer portions using, for example LPCVD including surface thermal decomposition of a silane ($SiH_4$) precursor at a temperature of about 550° C. to about 650° C. followed by annealing in an inert gas, e.g., nitrogen at a temperature of about 800° C. to about 950° C. Preferably, the polysilicon layer 16 is deposited (grown) to a thickness of about 1000 Angstroms to about 2000 Angstroms, for example about 1500 Angstroms.

Figure 1B:
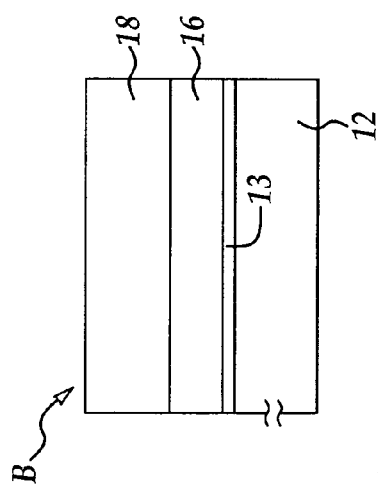
Figure 1B:
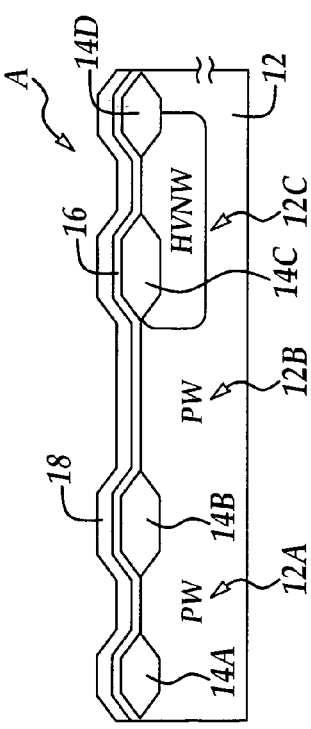

Referring to FIG. 1B, according to an aspect of the invention a silicon nitride (e.g., $Si_3N_4$) layer 18 is blanket deposited over wafer portions A and B over the polysilicon layer 16 in contrast with prior art methods of first carrying out patterning and etching the polysilicon layer 16 over active areas in the HV device area (wafer portion A). The silicon nitride layer 18 is preferably deposited by an LPCVD process to a thickness of about 1000 Angstroms to about 3000 Angstroms, for example, about 2000 Angstroms at a temperature of about 750° C. to about 850° C.

Figure 1C:
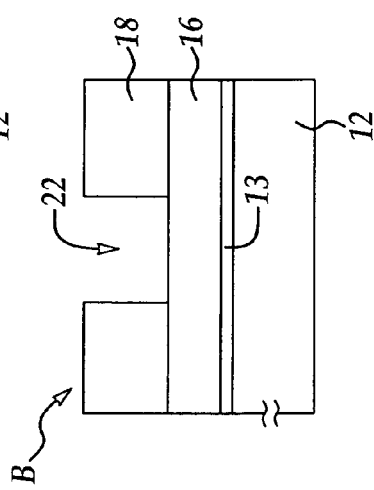
Figure 1C:
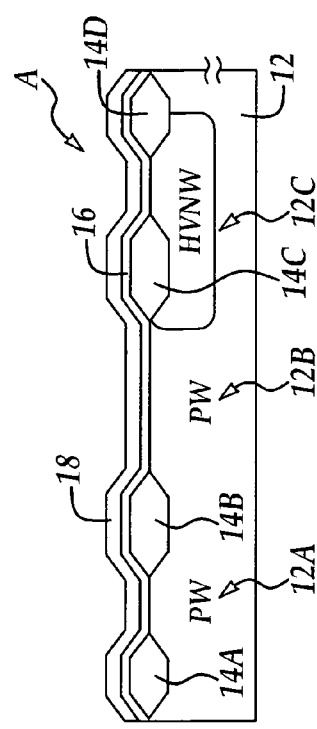

Referring to FIG. 1C, following deposition of the silicon nitride layer 18, a photolithographic patterning process (overlying photoresist layer not shown) followed by a wet or dry etching process, preferably a dry reactive ion etch (RIE) process, is carried out over wafer portion B to etch through the thickness of the silicon nitride layer 18 to form opening 22 and expose the underlying polysilicon layer 16 which forms the upper portion of a subsequently formed polysilicon electrode in a split gate MOSFET. Following the etching process to expose a portion of the polysilicon layer 16, optionally an ion implantation process may be carried out by known processes to implant N-type dopants, for example phosphorous into the exposed polysilicon portion to reduce a polysilicon sheet resistance. In addition, preferably, following stripping of the photoresist layer (not shown) used in the patterning process, the wafer process surface is cleaned, for example using a cleaning process including at least one of an HF dip, an SC-1 ($NH_4OH$, $H_2O_2$, H2O) dip, and an SC-2 (HCl, $H_2O_2$, H2O) dip to remove any remaining residues an contaminants including residual oxides over the exposed polysilicon surface prior to the subsequent step of growing a thermal oxide over the exposed polysilicon layer portion.

Referring to FIG. 1D, according to another aspect of the invention a thermal oxide (e.g., $SiO_2$) layer 24A is grown over the exposed polysilicon portion at the bottom of opening 22 by a furnace oxidation method including either a wet or dry oxidation process, for example a wet oxidation process including in-situ generated steam at a temperature of about 850° C. o about 1050° C., for example about 900° C., to a thickness of about 800 Angstroms to about 1200 Angstroms, for example about 1000 Angstroms. While the oxide thickness 24A in a preferred method of forming the split gate MOSFET is more preferably deposited to a thickness of about 2000 Angstroms in forming a polysilicon gate electrode, according to an aspect of the invention, the oxide growth step is advantageously separated into two separate steps to grow a first portion e.g., 24A followed later by growth of a second portion simultaneously with formation of the HV device gate oxide in wafer portion A as explained below.

Referring to FIG. 1E, a photolithographic patterning process followed by an etching process is carried out to etch through selected portions of the silicon nitride layer 18 and the polysilicon layer 16 to expose active area portions of the silicon substrate in wafer portion A including active regions overlying the P-well portion 12B and HV N-well (HVNW) portion 12C. During the etching process, photoresist layer e.g., 20A protects the wafer portion B and selected portions of wafer area A. For example, the etching process is preferably a dry (RIE) etching process including a chlorofluorocarbon and optionally, an oxygen etching chemistry. It will be appreciated that an etching chemistry including HBr and $Cl_2$ may be optionally used for etching the polysilicon portion.

Referring to FIG. 1F, following the RIE etching process to expose active area portions in wafer portion A, the photoresist layer 20A is stripped and a thermal oxide layer 26 is grown over exposed portions of the silicon substrate 12 in wafer portion A and simultaneously grown over previously deposited oxide layer 24A in wafer portion B to form oxide layer 24B. The oxide layer is preferably thermally grown by a wet or dry furnace process, more preferably a wet oxidation process including in-situ generated steam at a temperature of about 850° C. to about 1050° C., for example about 900° C., to a thickness of about 950 Angstroms to about 1050 Angstroms, more preferably about 1000 Angstroms. The thickness of the thermal oxide layer e.g., 26 in wafer portion A and 24B in wafer portion B, is an important aspect of the invention since the thermal oxide layer 26 forms a gate oxide for the HV device as well as forming the final preferred thickness of the oxide layer e.g., 24B by adding to the thickness of the previously formed oxide layer e.g., 24A to form a total predetermined thickness of about 1800 to about 2200 Angstroms, more preferably about 2000 Angstroms.

Referring to FIG. 1G, a photoresist layer 20B is deposited over the active portion of the process wafer portion A to protect the gate oxide layer 26, followed by RIE etching to remove remaining portions of silicon nitride layer 18 and polysilicon layer 16 over wafer portion A and selected portions of polysilicon layer 16, using the oxide layer 24B as a hard mask over wafer portion B to form a polysilicon gate electrode, for example a polysilicon floating gate electrode e.g., 28 from polysilicon layer 16 including overlying oxide layer 24B forming an oxide spacer.

Referring to FIG. 1H, following stripping photoresist layer 20B, conventional masking and ion implantation processes as are known in the art are carried for forming source and drain regions, e.g., 30A, 30B, and 30C including N+, and P+ doping regions over wafer portion A as are known in the art. In addition, another thermal oxide growth process is preferably carried to form an inter-poly oxide layer e.g., 24C over exposed polysilicon sidewall portions of the polysilicon electrode 28 in wafer portion B. A second polysilicon layer is then blanket deposited over the process surface according to an LPCVD method to a thickness of about 1000 to about 2000 Angstroms. Optionally, the second polysilicon layer may be deposited as an amorphous polysilicon layer a PECVD process together with in-situ doping. For example, an n type dopant is added in-situ in a CVD amorphous silicon deposition process carried out at temperatures of less than about 580° C. to avoid crystallization, for example adding dopant gas, such as phosphine ($PH_3$) during the deposition process. Following formation of the second polysilicon layer a conventional photolithographic patterning and etching process is carried to form polysilicon electrodes e.g., 34A in wafer portion A and 34B in wafer portion B, for example a wordline polysilicon electrode portion in a spit gate configuration.

Thus, according to embodiments of the present invention, a cost effective method including the same overall thermal budget for producing a split gate memory device has been presented including integrated parallel manufacturing of a HV MOSFET the overall process requiring fewer steps compared to separate processes for forming the split gate and HV MOSFET devices thereby increasing a wafer throughput. In addition, reliable operation of both the split gate flash memory device and the HV MOSFET device are achieved with adverse effect to doping profiles. In one embodiment, the embedded HV device preferably operates at a voltage of from about 40 Volts to about 60 Volts in conjunction with the split gate flash memory device, for example, to accomplish erase operations.

Figure 2:
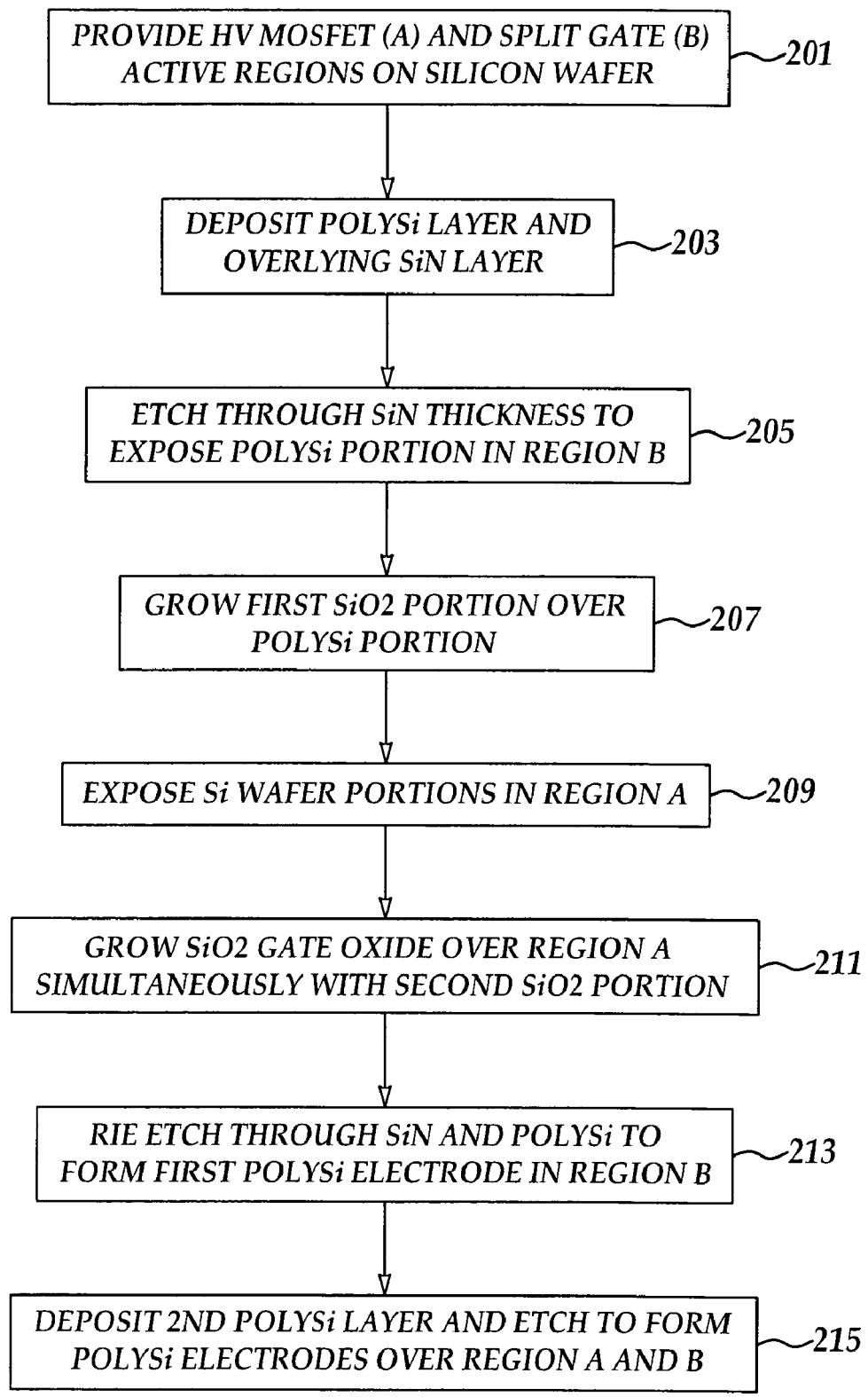
FIG. 2 is a process flow diagram including several embodiments of the present invention.

Referring to FIG. 2 is shown a process flow diagram including several embodiments of the present invention. In process 201, a silicon wafer is provided including wafer region A having HV MOSFET device active regions with adjacent isolation structures and wafer region B including split-gate MOSFET memory cell regions. In process 203, a polysilicon layer followed by a silicon nitride layer is blanket deposited over the process surface. In process 205, a photolithographic patterning and etching process is carried out to etch through a thickness portion of the silicon nitride layer to expose a portion of the underlying polysilicon area in wafer portion B. In process 207, a first portion of an oxide spacer layer overlying the exposed polysilicon portion in wafer portion B is thermally grown. In process 209, a photolithographic patterning an etching process is carried to etch through a remaining polysilicon layer thickness to expose portions of the silicon wafer in HV active device region in wafer portion A. In process 211, a gate oxide is thermally grown over the exposed silicon wafer portions in wafer portion A while simultaneously growing a second portion of the oxide spacer layer in wafer portion B to achieve a final predetermined thickness of both the gate oxide and oxide spacer. In process 213, a photolithographic and etching process is carried out to remove remaining silicon nitride layer and polysilicon layer portions over wafer portion A while simultaneously etching through the silicon nitride layer and polysilicon layer portions in wafer portion B to form a first polysilicon gate electrode. In process 215, subsequent processes to form polysilicon electrodes are undertaken including growing an inter-poly oxide layer over the first polysilicon gate electrode in wafer portion B followed by deposition of second polysilicon layer over both wafer portions A and B followed by a photolithographic and etching process to form polysilicon electrodes over both wafer portions A and B.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for integrated processing of a high Voltage MOSFET device and a split gate MOSFET device comprising the steps of:
   providing a substrate comprising a first active region and a second active region, said first and second active device regions comprising a first polysilicon layer overlying the silicon substrate and a silicon nitride layer overlying the first polysilicon layer;
   photolithographically patterning and etching through a thickness portion of the silicon nitride layer to expose a portion of the first polysilicon layer in the second active region;
   forming a first portion of a dielectric layer overlying the polysilicon portion while blocking oxide growth over the first active region;
   etching selected portions of the silicon nitride layer and first polysilicon layer to form exposed portions of the silicon substrate over the first active region while leaving the second active region unetched; and,
   forming a gate dielectric layer over the exposed portions of the substrate in the first active region to a predetermined thickness while simultaneously forming a second portion of the dielectric layer over the second active region to form the dielectric layer at a final predetermined thickness.

2. The method of claim 1, further comprising the steps of:
   photolithographically patterning and etching through a thickness of the silicon nitride layer and the polysilicon layer in the first and second active regions to form a first polysilicon electrode in the second active region;
   thermally growing a third oxide layer over exposed portions of the first polysilicon electrode;
   blanket depositing a second polysilicon layer; and,
   photolithographically patterning and etching through a thickness of the second polysilicon layer to form second polysilicon electrodes over the first and second active regions.

3. The method of claim 2, further comprising an ion implantation step over active region B prior to growing the first oxide layer and over active region A prior to thermally growing the gate oxide layer.

4. The method of claim 2, wherein the second polysilicon layer comprises an in-situ doped amorphous layer.

5. The method of claim 2, wherein the second polysilicon electrode over the second active region comprises a word-line polysilicon electrode formed adjacent the first polysilicon electrode.

6. The method of claim 1, wherein the first active region comprises a high voltage MOSFET for operation at a voltage of from about 30 Volts to about 60 Volts.

7. The method of claim 6, wherein the first active region includes electrically isolating field oxide LOCOS structures.

8. The method of claim 1, wherein the gate oxide layer and the second portion of the oxide layer are formed to a thickness of from about 800 to about 1200 Angstroms.

9. The method of claim 8, wherein the first portion of the oxide layer is formed at a thickness of about 800 to about 1200 Angstroms.

10. The method of claim 1, wherein the polysilicon layer is formed at a thickness of about 1000 Angstroms to about 2000 Angstroms.

11. The method of claim 1, wherein the silicon nitride layer is formed at a thickness of about 1000 Angstroms to about 3000 Angstroms.

12. The method of claim 1, wherein the first polysilicon electrode comprises a floating gate electrode in a split gate configuration.

13. A method for integrated processing of a high Voltage MOSFET device and a split gate MOSFET device comprising the steps of:
   providing a silicon process wafer comprising a first active region for HV MOSFET device formation including isolation structures and a second active device region for forming split-gate MOSFET flash memory devices;
   blanket depositing a first polysilicon layer;
   blanket depositing a silicon nitride layer over and contacting the polysilicon layer;

photolithographically patterning and etching through a thickness portion of the silicon nitride layer to form an exposed polysilicon portion of the polysilicon layer in the second active region;

growing a first oxide layer portion overlying the exposed polysilicon portion to a first predetermined thickness while blocking oxide growth over the first active region;

photolithographically patterning and etching selected portions of the silicon nitride layer and the polysilicon layer over the first active region to form exposed silicon portions of the silicon wafer;

thermally growing a gate oxide over the exposed silicon portions to a predetermined thickness while simultaneously growing a second oxide layer portion over the first oxide layer portion to form an oxide spacer at a final predetermined thickness; and, etching through a thickness of the silicon nitride layer and the polysilicon layer to form a first polysilicon electrode underlying the oxide spacer.

14. The method of claim 13, further comprising the steps of:
forming source and drain regions in the first active region;
growing a third oxide layer over exposed portions of the first polysilicon electrode;
blanket depositing a second polysilicon layer; and,
photolithographically patterning and etching the second polysilicon layer to form second polysilicon electrodes over the first and second active regions.

15. The method of claim 14, wherein the second polysilicon electrode over the second active region comprises a wordline polysilicon electrode formed adjacent the first polysilicon electrode.

16. The method of claim 13, wherein the first active region comprises a silicon substrate region for forming high voltage MOSFETS operating at a voltage of from about 30 Volts to about 60 Volts.

17. The method of claim 13, wherein the gate oxide layer and second oxide layer portions are formed to a thickness of from about 800 to about 1200 Angstroms.

18. The method of claim 13, wherein the first oxide layer portion is formed at a thickness of about 800 to about 1200 Angstroms.

19. The method of claim 13, further comprising an ion implantation step prior to the steps of growing a first oxide layer portion and thermally growing a gate oxide layer.

20. The method of claim 13, wherein the first polysilicon electrode comprises a floating gate electrode in a split gate configuration.

* * * * *